United States Patent
Moksvold

[11] Patent Number: 5,274,267
[45] Date of Patent: Dec. 28, 1993

[54] BIPOLAR TRANSISTOR WITH LOW EXTRINSIC BASE RESISTANCE AND LOW NOISE

[75] Inventor: Tor W. Moksvold, Poughkeepsie, N.Y.

[73] Assignee: International Business Machines Corporation, Armonk, N.Y.

[21] Appl. No.: 830,039

[22] Filed: Jan. 31, 1992

[51] Int. Cl.$^5$ .................. H01L 29/72; H01L 21/265
[52] U.S. Cl. ........................................ 257/592; 257/593
[58] Field of Search ............... 257/592, 593, 653, 655; 437/31

[56] References Cited

U.S. PATENT DOCUMENTS

| | | | |
|---|---|---|---|
| 3,915,767 | 10/1975 | Welliver | 148/190 |
| 4,381,953 | 5/1983 | Ho et al. | 148/1.5 |
| 4,706,378 | 11/1987 | Havemann | 437/24 |
| 4,824,799 | 4/1989 | Komatsu | 437/162 |
| 4,866,000 | 9/1989 | Okita | 437/31 |
| 4,879,252 | 11/1989 | Komatsu | 437/31 |
| 4,980,302 | 12/1990 | Shimizu | 437/31 |
| 4,987,089 | 1/1991 | Roberts | 437/34 |
| 4,996,581 | 2/1991 | Hamasaki | 357/34 |

Primary Examiner—Mark V. Prenty
Attorney, Agent, or Firm—Richard A. Romanchik; Michael J. Balconi-Lamica

[57] ABSTRACT

An improved NPN transistor and method of building thereof includes: a P— substrate 50; a N+ buried region 52 provided therein; a N— epitaxial layer 56 deposited onto the N buried region; a P base diffusion region 66 in the N— epi layer; a N+ reach-through region 60 through the N— epi layer to the N+ buried layer to thereby define a collector; a N++ implant or diffusion region 102 provided in the P base diffusion region to thereby define an emitter; and a P++ implant region 74 provided around the N++ emitter implant region which thereby defines the extrinsic base of the transistor, wherein the P++ implant region extends through the P region into the N— epi layer and wherein the P++ implant region extends as close to the N++ emitter implant region as possible without encroaching on the emitter.

18 Claims, 6 Drawing Sheets

BIPOLAR TRANSISTOR WITH LOW EXTRINSIC BASE RESISTANCE AND LOW NOISE

TECHNICAL FIELD

This invention is related to transistors, and more particularly to a bipolar transistor having low extrinsic base resistance and low noise.

BACKGROUND OF THE ART

A conventional NPN transistor 10 is illustrated in FIG. 1 wherein a P− substrate 12 has a N+ buried region 14 disposed thereon. A N− epitaxial layer 16 is deposited on the N+ buried region 14. A pair of N+ regions 18, 20 reach through the N− layer 16 and provide access for a contact 22 to define a collector electrode which is accessible via line 24. A P region 30 is defined in the N− layer and contacts 32, 34 provide access to this base region. A line 36 provides access to contacts 32, 34. A N++ region 38 is provided in the P region 30 and a contact 40 and a line 42 define the emitter of the transistor 10. The base region 30 may be diffused or ion implanted. A SiO$_2$ layer 21 provides isolation.

In the prior art pertaining to this and other bipolar transistor designs, the sheet resistance value of the base is a compromise of conflicting demands. For a given emitter and base width, a high base sheet resistance is desirable to achieve a high performance device by increasing the gain, increasing the emitter injection efficiency, lowering the emitter base capacitance, and increasing the frequency response of the transistor.

A high base sheet resistance, however, will result in high extrinsic base resistance which is undesirable for certain circuit applications.

Another serious consequence of the high extrinsic base resistance is increased transistor noise. Increased noise is undesirable in most applications, but it is especially critical in applications where detection and processing of low level signals is required. A low base sheet resistance is therefore desirable to achieve low extrinsic base resistance and low noise.

Prior art transistor base sheet resistance values have been compromised between these conflicting demands for high and low sheet resistance. A bipolar transistor which resolves this conflict and provides for high gain, low extrinsic base resistance, and low noise while not significantly increasing the manufacturing costs of prior art transistors is therefore highly desirable.

DISCLOSURE OF THE INVENTION

An object of the present invention is to provide for a NPN transistor having low extrinsic base resistance and low noise.

Another object of the present invention is to provide a low cost, effective methodology to lower the extrinsic base resistance of the existing NPN transistor designs without degrading other transistor characteristics.

According to a first embodiment of the present invention a NPN transistor includes: a P− substrate; a N+ buried subcollector region provided therein; a N− epitaxial layer deposited onto the N buried region; a P base diffusion region in the N− epi layer; a N+ reach-through region through the N− epi layer to the N+ buried layer to thereby define a collector; a N++ implant region provided in the P base diffusion region to thereby define an emitter; and a P++ implant region provided around the N++ emitter implant region which thereby defines the extrinsic base of the transistor, wherein the P++ implant region extends through the P region into the N− epi layer and wherein the P++ implant region extends as close to the N++ emitter implant region as possible without adversely affecting the intrinsic transistor operation by encroaching on the emitter.

The present invention provides for an improved NPN transistor having low extrinsic base resistance and low noise while retaining other favorable characteristics and current ratings of existing NPN transistors. In addition, the process conditions for the present invention remains unchanged for prior transistors. Also, it is easy to implement, it is low cost, and it does not affect the reliability of existing transistors.

These and other objects, features, and advantages of the present invention will become more apparent in light of the detailed description of exemplary embodiments thereof, as illustrated by the drawings.

BEST MODE FOR CARRYING OUT THE INVENTION

Figure 2A:
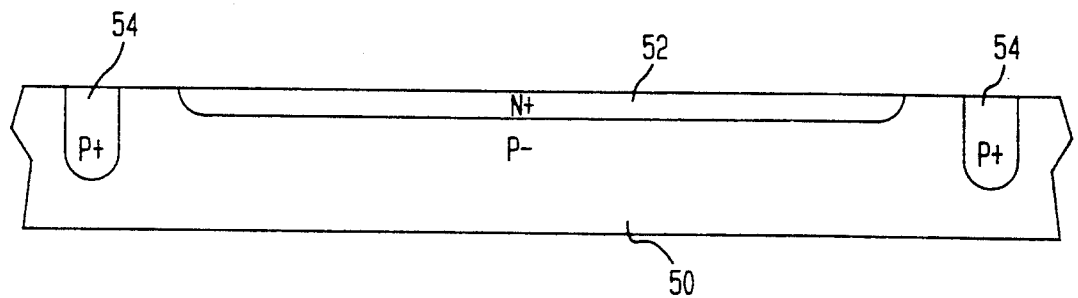
FIGS. 2A-2L are simplified cross-sectional views of the structures resultant from the method for providing an NPN transistor in accordance with a first embodiment of the present invention.

Referring now to FIG. 2A, a P− substrate 50 has a buried N+ subcollector region 52 provided therein. The N+ region is provided using doping techniques well known in the art such as arsenic ion implantation or diffusion. P+ diffusion regions 54 are provided around the N+ diffusion region 52 and are utilized for isolation purposes. These regions 54 are doped in a manner well known in the art, such as by boron doping.

Figure 2B:
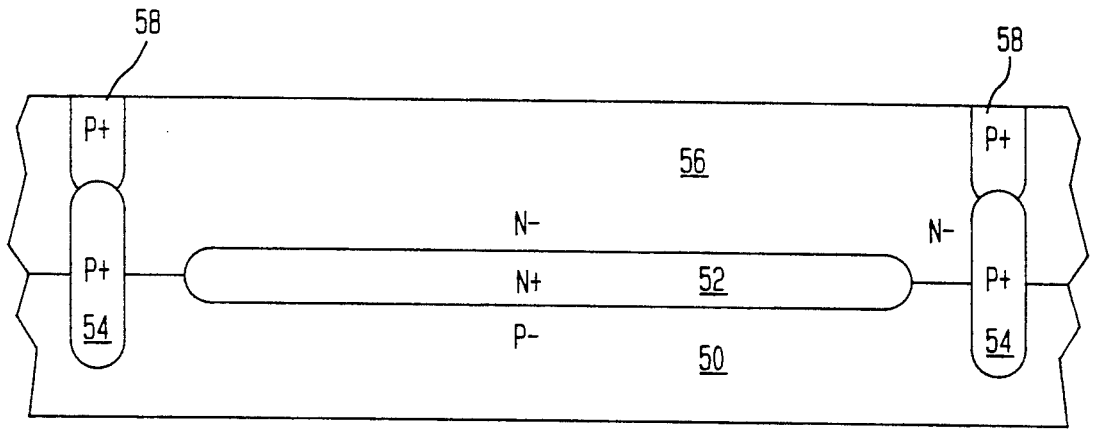

Referring now to FIG. 2B, a N− epitaxial layer 56 is grown on the substrate utilizing epitaxial growth techniques well known in the art. The structures are then heated or annealed to expand the diffusion regions 52, 54. Additional P+ diffusion regions 58 are then provided in the N− epitaxial layer 56 in a manner similar to the P+ regions 54. It is to be noted that P+ regions 54, 58 provide isolation for the areas therebetween. Other isolation techniques known in the art, however, may also be utilized to provide isolation.

Figure 2C:
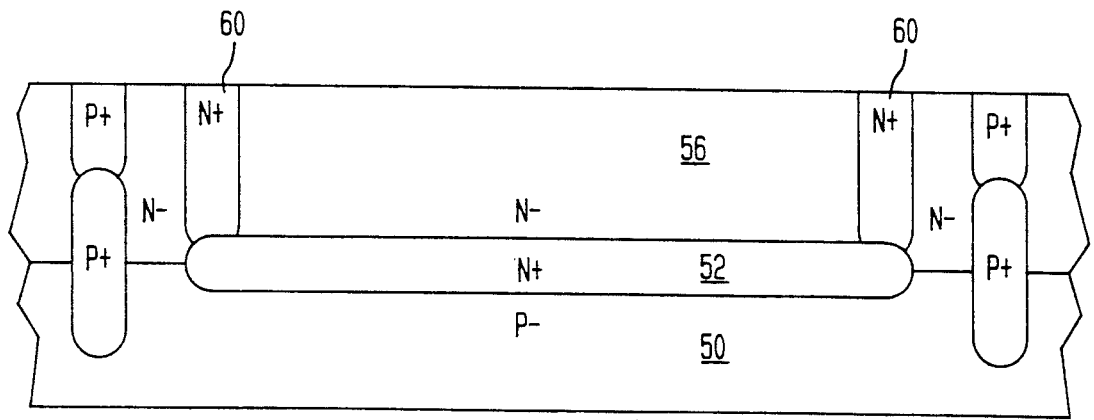

Referring now to FIG. 2C, N+ reach-through diffusion regions 60 are provided through the N− epitaxial layer 56 in a manner well known in the art.

Figure 2D:
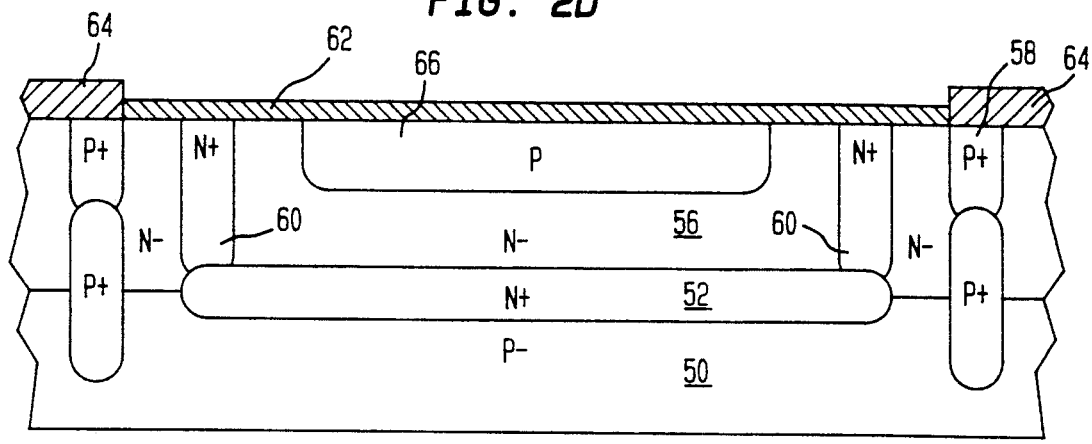

Referring now to FIG. 2D, a layer of oxide 62, such as silicon dioxide (SiO$_2$) is deposited after a P base diffusion region 66 has been provided in the N− epi layer 56 utilizing diffusion techniques well known in the art. Additional insulation is provided in regions 64 from the isolation reach-through regions 58 outward.

Figure 2E:
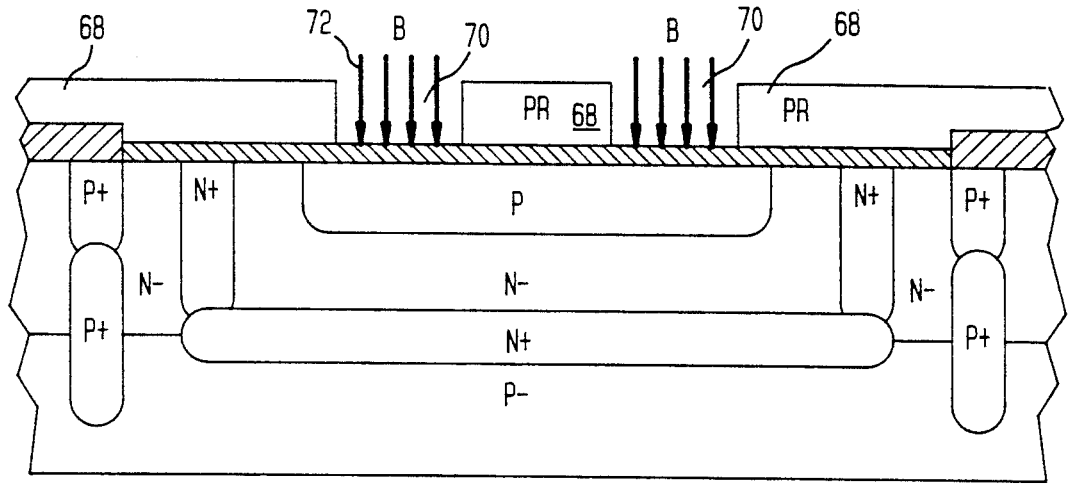

Referring now to FIG. 2E, a photoresist mask 68 is then deposited onto the oxide layers 62, 64. Next, a pattern is transferred through the photoresist layer 68 to provide access well 70 to the oxide layer 62. The substrate is then exposed to a boron implantation source as illustrated by arrows 72. The preferred method for the boron implantation is to provide Boron 11 in a dose of 9E14 ions/cm² with a kinetic energy of 180 keV.

Figure 2F:
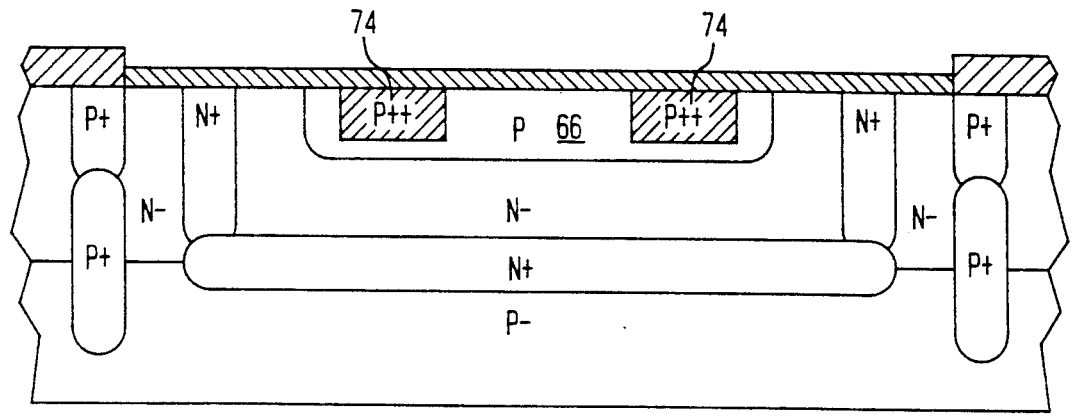

Referring now to FIG. 2F, the boron doping implantation step described and illustrated hereinbefore in FIG. 2E provides P++ highly doped (a doping concentration greater than P+ regions 54), highly conductive implant regions 74 in the P base diffusion region 66. The photoresist layer 68 is then removed.

Figure 2G:
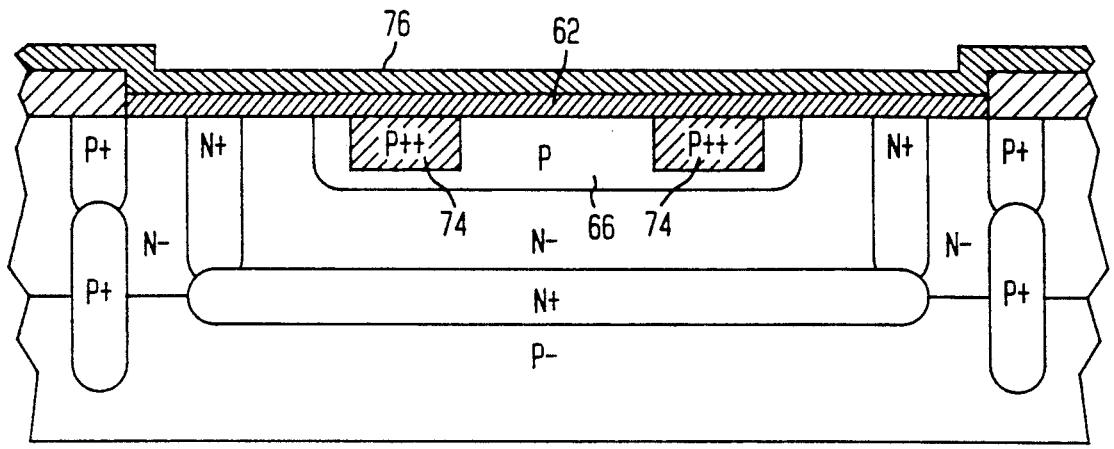

Referring now to FIG. 2G, a layer of silicon nitride ($Si_3N_4$) 76 is deposited onto the oxide layer 62 in a manner well known in the art.

Figure 2H:
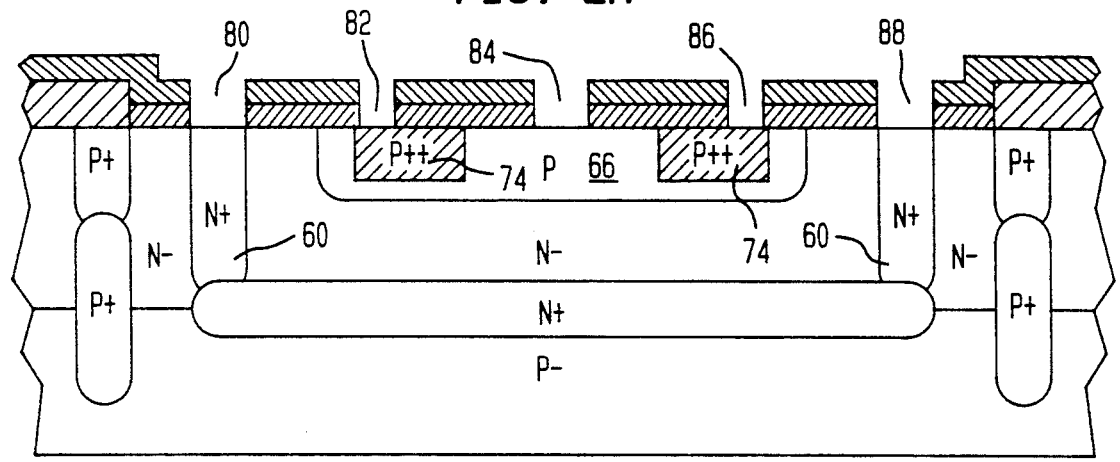

Referring now to FIG. 2H, a pattern is then transferred through the silicon nitride layer 76 and the oxide layer 62 to provide access wells 80, 82, 84, 86, 88 to the N+ reach-through region 60, the P++ region 74, the P base diffusion region 66, the P++ implant region 74 and the N+ reach-through region 60, respectively.

Figure 2I:
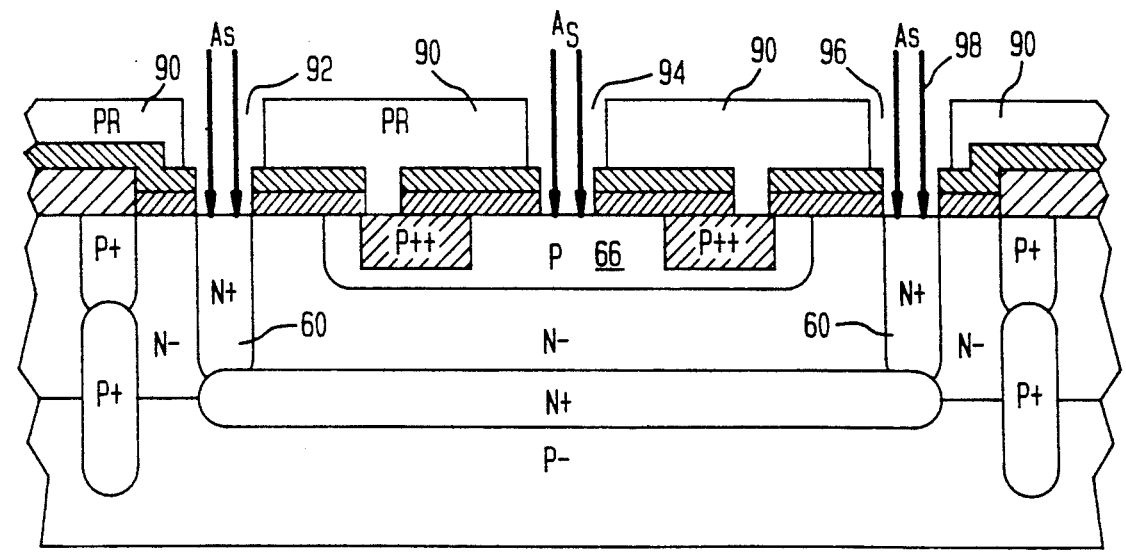

Referring now to FIG. 2I, a photoresist layer 90 is deposited onto the silicon nitride layer 76. A pattern is then transferred through the photoresist layer 90 to provide access wells 92, 94, 96 to the N+ reach-through region 60, P base diffusion region 66, and the N+ reach-through region 60, respectively. The structure is then exposed to an arsenic doping source as illustrated by arrows 98.

Figure 2J:
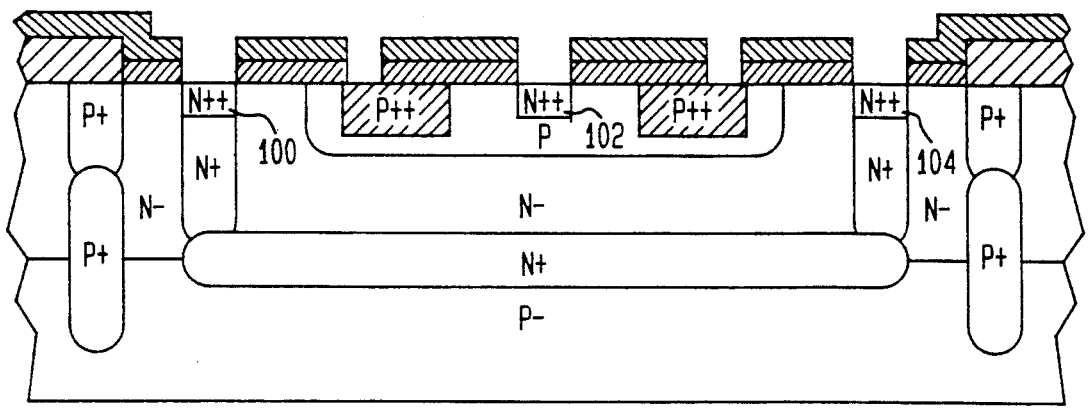

Referring now to FIG. 2J, the arsenic doping step described and illustrated hereinbefore in FIG. 2I provides highly doped N++ regions 100 (a doping concentration greater than N+ regions 60, 52), 102, 104, where N++ region 102 is an emitter region. The photoresist layer 90 is then removed.

Figure 2K:
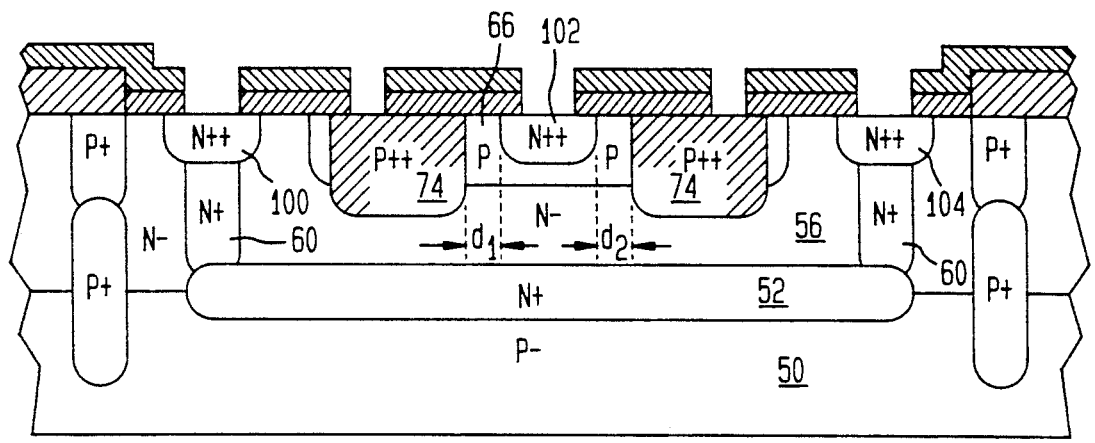

Referring now to FIG. 2K, the entire structure is annealed by heating to a temperature of approximately 1000° C. for approximately 100 minutes in order to cause outward diffusion of the doped regions 74, 100, 102, 104. This annealing step causes the distances $d_1$, $d_2$ between the N++ emitter region 102 and the P++ regions 74 to be reduced. It is preferable that the distance d1 and d2 between the N++ region 102 and the P++ diffusion be as small as practically possible. These regions however, cannot touch because contact therebetween would destroy the function of the transistor. In the preferred embodiment the distances d1 and d2 are on the order of 1 to 3 microns in the mask design dimensions.

Figure 2L:
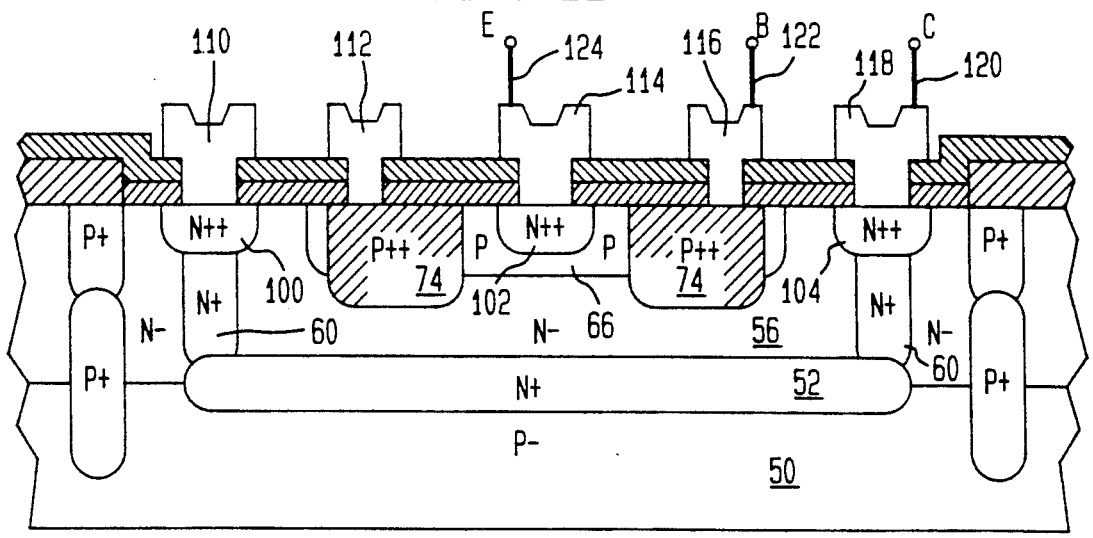

Referring now to FIG. 2L, metal contacts 110-118 are deposited in wells 80-88 to provide electrical contact to the regions 100, 74, 102, 74, 104. A NPN transistor in accordance with the present invention is thus constructed wherein the collector connections are represented by a line 120, the base connection is represented by a line 122 and the emitter connection is represented by a line 124.

The highly doped P++ regions 74 provide for a low extrinsic base resistance, thereby significantly reducing noise also. Since the highly doped extrinsic implants 74 overlap the base contacts 112, 116, the base contact resistance is also very low. In addition, the intrinsic emitter/base configurations of prior NPN transistors is retained by spacing the extrinsic base implants 74 away from the emitter.

Figure 3:
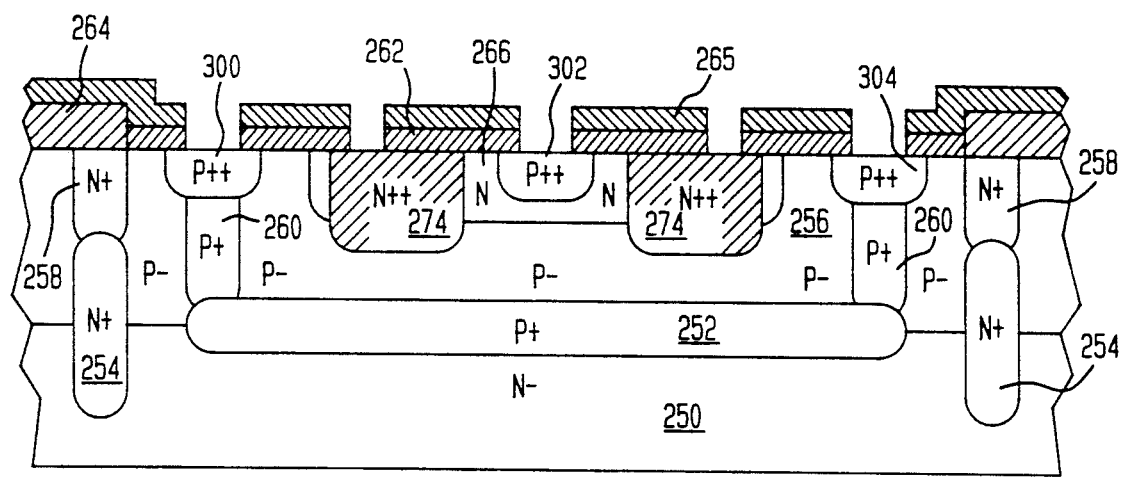
FIG. 3 is simplified cross-sectional view of the structures resultant from the method for providing a PNP transistor in accordance with a second embodiment of the present invention.

Referring now to FIG. 3, a PNP transistor in accordance with the present invention includes: a N− substrate 250; a buried P+ diffusion subcollector region 252; N+ areas 254, 258 for isolation; a P− epitaxial layer 256; P+ reach-through diffusion regions 260; oxide layers 262, 264; an insulation layer 265; a N base diffusion region 266; N++ implant regions 274; and, P++ regions 300, 302, 304. The structure illustrated in FIG. 3 is similar to the structure illustrated in FIG. 2K, but with the conductivity of the doped regions reversed. Likewise, the structure illustrated in FIG. 3 is built in a manner similar to the method described in FIGS. 2A-2L, but reversing the doping conductivity types.

Figure 1:
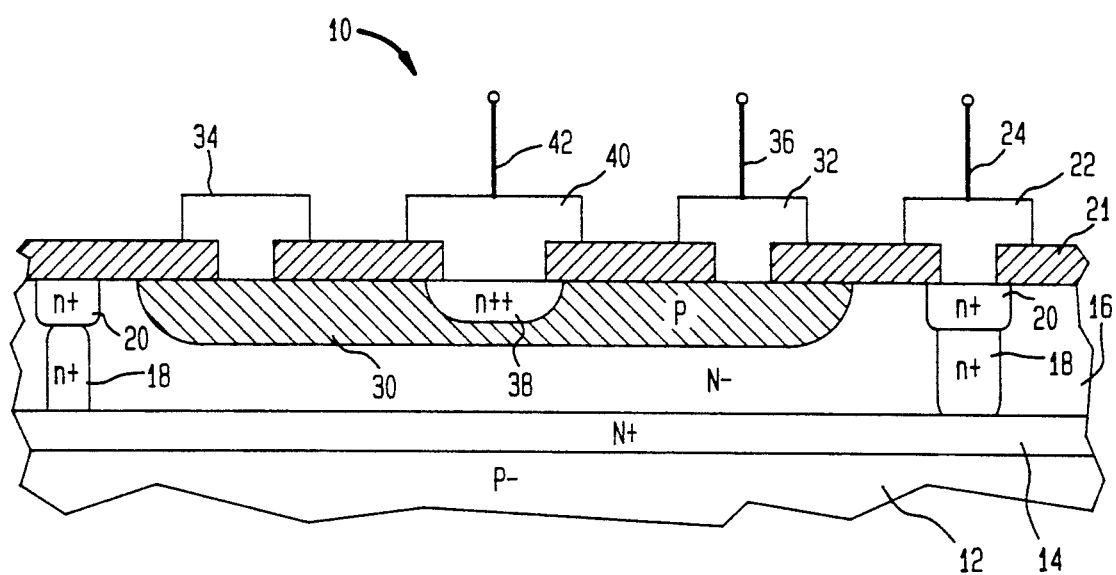
FIG. 1 is a simplified cross-sectional view of a prior art NPN transistor.

It is to be noted that the present invention provides for approximately a fifty percent reduction in extrinsic base resistance, with a corresponding reduction in noise compared to the structure illustrated in FIG. 1. Also, implementation of the present invention is achieved without adding additional mask levels or process steps to the prior processes by utilizing a P++ ion implanted resistor process and adding the P++ extrinsic base implant shapes to the P++ resistor mask. The present invention is also transparent to other devices which retain their characteristics. By placing the highly doped intrinsic base implants 74 inside the low doped base diffusion region 66, changes to the base collector parameter junction are avoided and the base to reach-through guard ring ground rule is retained. This minimizes changes to existing NPN transistors, thereby enabling existing macros and chip layouts to be utilized. The present invention separates the intrinsic and extrinsic base regions and can therefore be utilized to develop technology extensions since the intrinsic base and emitter can be optimized independent of the extrinsic base. The present invention therefore provides a very cost effective method for upgrading existing bipolar transistors.

Although the invention has been shown and described with exemplary embodiments thereof, it should be understood by those skilled in the art that the foregoing and various other changes, omissions and additions may be made therein and thereto without departing from the spirit and the scope of the invention.

I claim:

1. A NPN transistor comprising:
   a) a P− substrate;
   b) a N− epitaxial layer disposed on said P− substrate;
   c) a N+ subcollector region disposed at the interface of said P− substrate and said N− epitaxial layer;
   d) a N+ reach-through region through said N− epitaxial layer to said N+ subcollector to thereby define a collector;
   e) a P base diffusion region provided in said N− epitaxial layer;
   f) a N++ emitter region formed by doping a desired region in said P base diffusion region, and annealing said N++ emitter region to thereby define an emitter; and,
   g) a P++ extrinsic base implant region formed by ion implantation of a desired region inside said P base diffusion region, said P++ extrinsic base implant region further being outwardly diffused and provided through said P base diffusion region and extending into said N− epitaxial layer upon annealing said P++ extrinsic base implant region to thereby define an extrinsic base of the transistor, the annealing of said N++ emitter region and said P++ extrinsic base implant region occurring at the same time.

2. A NPN transistor according to claim 1, wherein said P++ implant region is in close proximity to said N++ region.

3. A NPN transistor according to claim 1, wherein said P++ implant region surrounds said N++ region and is in close proximity to said N++ region.

4. A NPN transistor according to claim 1, wherein said P++ implant region is spaced from said N++ region by a distance on the order of one to three microns.

5. A PNP transistor comprising:
a) a substrate including an N− portion;
b) a P− epitaxial layer disposed on said substrate;
c) a P+ subcollector region disposed at the interface of said substrate and said P− epitaxial layer;
d) a P+ reach-through region provided through said P− epitaxial layer to said P+ subcollector to thereby define a collector;
e) a N base diffusion region provided in said P− epitaxial layer;
f) a P++ emitter region formed by doping a desired region in said N base diffusion region, and annealing said P++ emitter region to thereby define an emitter; and,
g) a N++ extrinsic base implant region formed by ion implantation of a desired region inside said N base diffusion region, said N++ extrinsic base implant region further being outwardly diffused and provided through said N base diffusion region and extending into said p− epitaxial layer upon annealing said N++ extrinsic base implant region to thereby define an extrinsic base of the transistor, the annealing of said P++ emitter region and said N++ extrinsic base implant region occurring at the same time.

6. A PNP transistor according to claim 5, wherein said N++ implant region is in close proximity to said P++ region.

7. An PNP transistor according to claim 5, wherein said N++ implant region surrounds said P++ region and is in close proximity to said P++ region.

8. A PNP transistor according to claim 5, wherein said N++ implant region is spaced from said P++ region by a distance on the order of one to three microns.

9. A transistor comprising:
a) a substrate including a portion of a first conductivity type having a first dopant concentration;
b) an epitaxial layer of a second conductivity type disposed on said substrate and having a second dopant concentration;
c) a subcollector region of said second conductivity type disposed at the interface of said substrate and said epitaxial layer, said subcollector region having a third dopant concentration;
d) a reach-through region of said second conductivity type provided through said epitaxial layer to said subcollector region to thereby define a collector, said reach-through region having said third dopant concentration;
e) a base diffusion region of said first conductivity type provided in said epitaxial layer, said base diffusion region having a fourth dopant concentration;
f) an emitter region of said second conductivity type formed by doping a desired region in said base diffusion region, and annealing said emitter region to thereby define an emitter, said emitter region having a fifth dopant concentration; and,
g) an extrinsic base implant region of said first conductivity type formed by ion implantation of a desired region inside said base diffusion region, said extrinsic base implant region further being outwardly diffused and provided through said base diffusion region and extending into said epitaxial layer upon annealing said extrinsic base implant region to thereby define an extrinsic base of the transistor, said region having a sixth dopant concentration, the annealing of said emitter region and said extrinsic base implant region occurring at the same time.

10. A transistor according to claim 9, wherein said extrinsic base implanted region is in close proximity to said emitter region.

11. A transistor according to claim 9, wherein said extrinsic base implanted region surrounds said emitter region and is in close proximity to said emitter region.

12. A transistor according to claim 9, wherein said extrinsic base implanted region is spaced from said emitter region by a distance on the order of one to three microns.

13. A transistor according to claim 9, wherein said first conductivity type is N and said second conductivity type is P.

14. A transistor according to claim 9, wherein said first conductivity type is P and said second conductivity type is N.

15. A transistor according to claim 9, wherein said fifth and sixth concentrations are greater than said third and fourth concentrations, and said third and fourth concentrations are greater than said first and second.

16. A NPN transistor according to claim 1, further comprising a base contact connected to said P++ extrinsic base implant region, said P++ extrinsic base implant region overlapping said base contact.

17. A PNP transistor according to claim 5, further comprising a base contact connected to said N++ extrinsic base implant region, said N++ extrinsic base implant region overlapping said base contact.

18. A transistor according to claim 9 further comprising a base contact connected to said extrinsic base implant region, said extrinsic base implant region overlapping said base contact.

* * * * *